(12) United States Patent
Farshi et al.

(10) Patent No.: US 6,396,692 B1
(45) Date of Patent: May 28, 2002

(54) ELECTRONIC CONTROL UNIT WITH INTEGRATED COOLING MODULE

(75) Inventors: Jasmin B. Farshi, Northbrook; Steven E. Larson, Barrington, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/627,210

(22) Filed: Jul. 27, 2000

(51) Int. Cl.[7] .................................................. H05H 7/20
(52) U.S. Cl. .................... 361/690; 123/41.31; 165/80.4; 361/699
(58) Field of Search .................... 123/41.31; 165/80.4; 257/714; 361/688–690, 698–699, 702, 704, 707, 711, 715, 749, 751–752

(56) References Cited

U.S. PATENT DOCUMENTS

| | | | |
|---|---|---|---|
| 4,364,355 A | 12/1982 | Karino | |
| 5,457,603 A | * 10/1995 | Leeb | ........................... 361/699 |
| 5,685,361 A | 11/1997 | Demmler et al. | |
| 5,740,015 A | * 4/1998 | Donegan et al. | ............ 361/699 |
| 5,929,518 A | 7/1999 | Schlaiss | |
| 5,998,738 A | 12/1999 | Li et al. | |

* cited by examiner

Primary Examiner—Gregory Thompson
(74) Attorney, Agent, or Firm—Gary J. Cunningham; Steven A. May; Thoams V. Miller

(57) ABSTRACT

An electronic control unit (20) comprising a cooling module (36) having at least one fluid channel (32) therein, a substrate (50) configured to define an interior region (52) and having an electronic component (54) mounted thereto, such that the electronic component (54) faces the interior region (52), and a cooling fluid (34) within the fluid channel (32), the cooling fluid (34) having a temperature below an operating temperature of the electronic component (54), wherein the cooling module (36) is positioned within the interior region (52), such that the heat generated by the electronic component (54) is convectively transferred to the cooling module (36). By integrating the cooling module (36) with the substrate (50) and by positioning the cooling module (36) in the interior region (52), the cooling module (36) is able to convectively cool the substrate (50).

18 Claims, 4 Drawing Sheets

SECTION 3-3

SECTION 6-6

ELECTRONIC CONTROL UNIT WITH INTEGRATED COOLING MODULE

FIELD OF THE INVENTION

This invention relates, in general, to a cooling module for an electronic control unit and, more particularly, to an integrated cooling module for an electronic control unit, wherein the integrated cooling module cools the electronic module using convection and conduction.

BACKGROUND OF THE INVENTION

Engine mounted electronic control units for diesel engines are subject to a high level of heat and vibration and their performance is often limited or impaired due to these conditions. Typically, in order to reduce the high level of heat and enhance thermal performance, traditional cooling methods such as the use of an external cooling plate or the use of a separate external fuel cooler, are implemented. However, traditional cooling methods are often not the most effective means for cooling electronic control units. For example, in a direct engine mount application where a Polybent™ printed circuit board, that is a printed circuit board that has a flexible circuit that is bent, is used for packaging an electronic control unit, an external cooling plate would not the most effective method for cooling the electronic control unit. In a Polybent™ printed circuit board, a printed circuit board is essentially folded in half, forming a u-shaped printed circuit board consisting of two main partitions facing each other. The two main partitions are connected to each other by a flexible circuit. One of the two main partitions is mounted near the engine block, leaving the second main partition to be mounted away from the engine block. Typically, in a Polybent™ printed circuit board, the external cooling plate can only enhance the heat dissipation of one main partition in between the control unit and the engine block. Therefore, heat dissipating components on the other main partition do not directly benefit from the presence of an external cooling plate and consequently the electronic control unit will not dissipate heat efficiently.

The presence of an external cooling plate is disadvantageous to the structural integrity of the electronic control unit having a Polybent™ printed circuit board, because the mass and stiffness of the external cooling plate amplifies the excitation signal originated from the engine block on which the electronic control unit is mounted to. Additionally, by the nature of design and functionality, the structural rigidity of an external cooling plate is similar to the structural rigidity of a Polybent™ printed circuit board, which in turn causes additional amplification of the excitation signal originating from the engine block due to a coupling effect.

Electronic control units that are not manufactured using a Polybent™ printed circuit board, but rather, are manufactured in a conventional manner using a flat printed circuit board, still have many limitations with traditional cooling methods. For example an external cooling plate or a separate external fuel cooler are all traditional cooling modules in which the thermal performance of the device depends on how well the device is mounted onto the electronic control unit. Since these traditional cooling modules rely on conductive heat transfer, they must come into direct contact with the surface of the electronic control unit that they are cooling. Variations within manufacturing processes limit the amount of contact that can be made between electronic control unit and these traditional cooling modules. Moreover, these traditional cooling modules subject the electronic control unit to increased vibration levels. These increased vibration levels cause intermittence in the contact area between the cooling module and the electronic control unit that impairs the cooling efficiency of the traditional cooling module. Further, as mentioned earlier, traditional cooling modules are not optimized for Polybent™ printed circuit boards.

Another device that can be used for cooling an electronic control unit is an integral backside cooling module. Backside cooling modules include a five-sided cast aluminum housing with copper tubing inserted into the cast aluminum housing during the molding process. The electronic control unit is then mounted to the housing using screws and the device uses conduction to remove the heat from the electronic control unit. Again backside cooling modules suffer similar problems as the traditional cooling modules in that they both use conductive heat transfer to cool the electronic control unit. Conductive heat transfer requires the cooling module to be in constant contact with the electronic control unit, a requirement that is very difficult to achieve with engine mounted electronic control units due to the harsh vibration levels incurred, as discussed above. Moreover, using copper tubing inserted into a cast aluminum housing is very risky since material mismatches will result in the device failing to cool the electronic module.

Accordingly, further development of cooling modules for cooling an electronic control unit, and more specifically, for cooling an electronic control unit mounted to an engine block, is necessary in order to increase and enhance heat dissipation efficiency of an electronic control unit.

Figure 1:
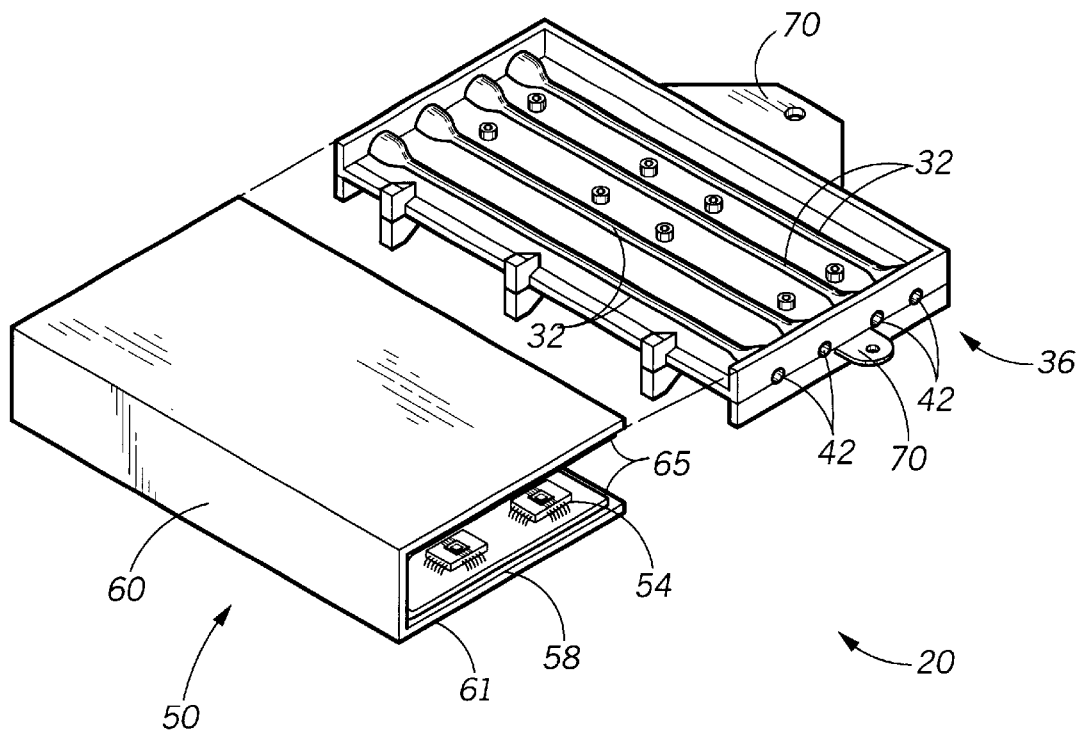
FIG. 1 is an exploded perspective view of a cooling module for an electronic control unit, according to one preferred embodiment.

It would be appreciated that for simplicity and clarity of illustration, elements shown in the Figures have not necessarily been drawn to scale. For example, dimensions of some elements are exaggerated relative to each other. Further, when considered appropriate, reference numerals have been repeated among the Figures to indicate corresponding elements.

DETAILED DESCRIPTION OF THE PRESENTLY PREFERRED EMBODIMENTS

In view of the above limitations of existing cooling modules for electronic control units, it is an aspect of the present invention to provide an electronic control unit including a cooling module having at least one fluid channel therein. The electronic control unit also includes a substrate configured to define an interior region and having an electronic component mounted thereto, such that the electronic component faces the interior region. A cooling fluid having a temperature below an operating temperature of the electronic component flows within the fluid channel. The cooling module is positioned within the interior region, such that the heat generated by the electronic component is convectively transferred to the cooling module. By integrating the cooling module and the substrate of the electronic control unit and by positioning the cooling module in an interior region of the substrate, the cooling module is able to convectively cool the entire substrate.

Unlike other integrated cooling modules, the cooling module of this invention is not required to be directly in contact or mounted onto the substrate of the electronic control unit, since the cooling module transfers heat by convection in addition to conduction. Moreover, since the substrate of the electronic module is not required to be in direct contact with the cooling module, the vibration of the electronic control unit does not impair the cooling efficiency of the cooling module. The cooling module of this invention convectively transfers heat from the electronic control unit, independent from any vibration induced upon the electronic control unit.

Shown in FIG. 1 is an exploded perspective view of an electronic control unit 20 including a cooling module 36 and a substrate 50. Substrate 50 includes an electronic component 54 and a circuit substrate 58. Electronic component 54 is any electronic component or device that can be mounted to a printed circuit board such as, for example, a battery, a capacitor, a resistor, a semiconductor chip, a diode, an inductor, and a coil. Electronic component 54 is mounted onto the surface of circuit substrate 58, as illustrated in FIG. 1. Typically, circuit substrate 58 has a number of electronic components 54 mounted on the surface of circuit substrate 58. These electronic components 54 are electrically connected to each other through a number of lands (not shown) and traces (not shown) printed on the surface and the internal layers of circuit substrate 58.

Figure 2:
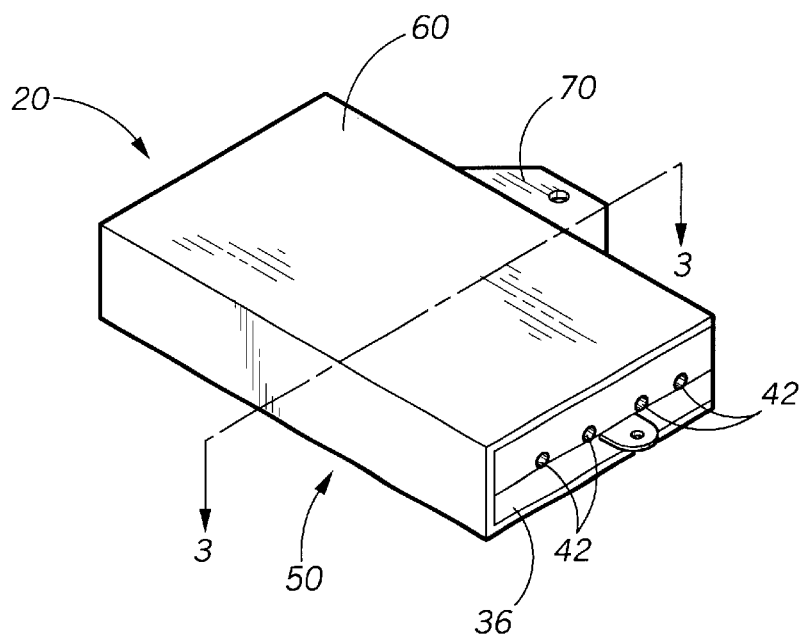
FIG. 2 is a perspective view of an electronic control unit with the cooling module mounted within the electronic control unit according to one preferred embodiment.
Figure 3:
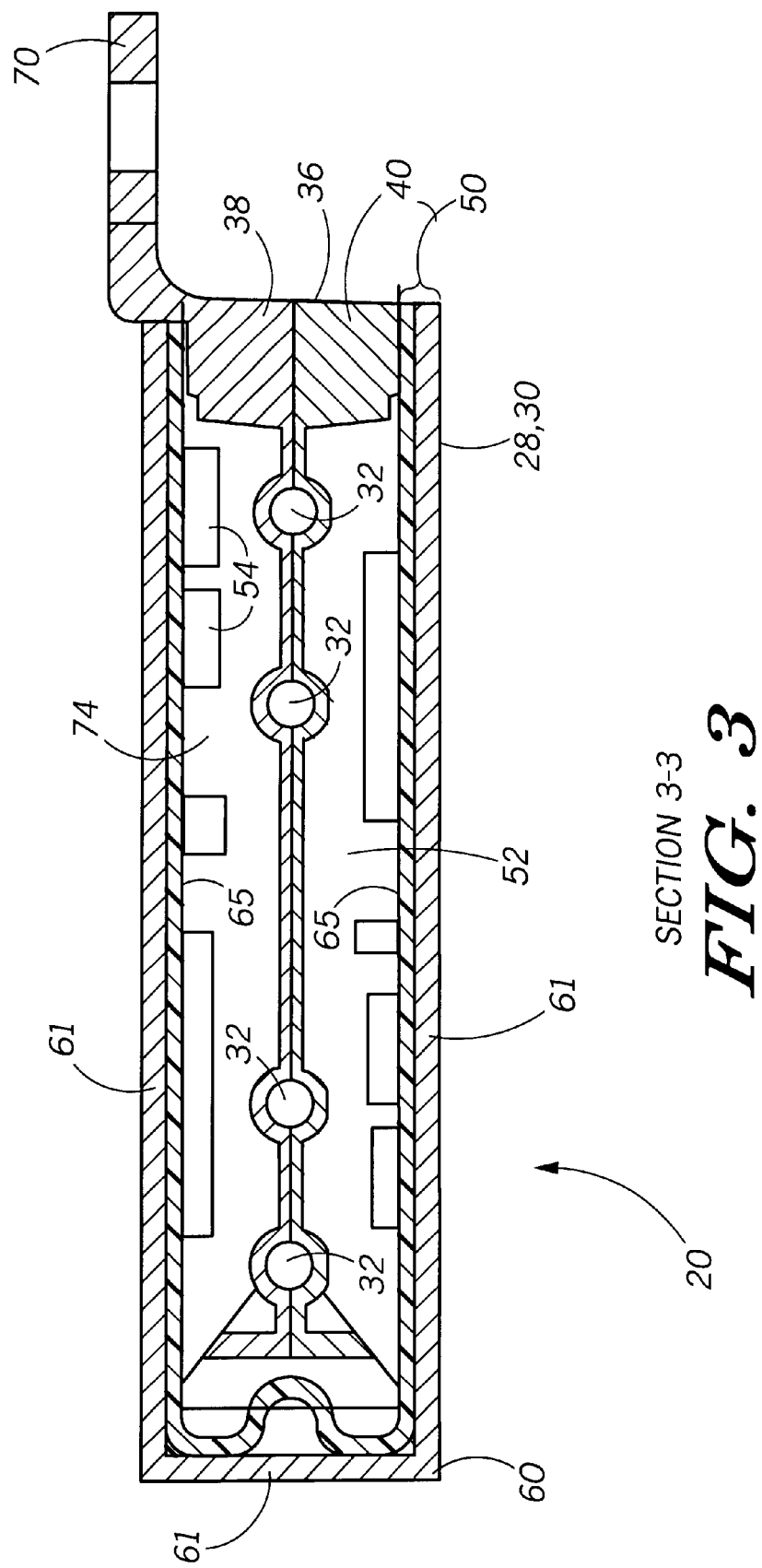
FIG. 3 is an enlarged cross-sectional view along lines 3—3 of the electronic control unit with the cooling module mounted within the electronic control unit shown in FIG. 2, according to one preferred embodiment.
Figure 4:
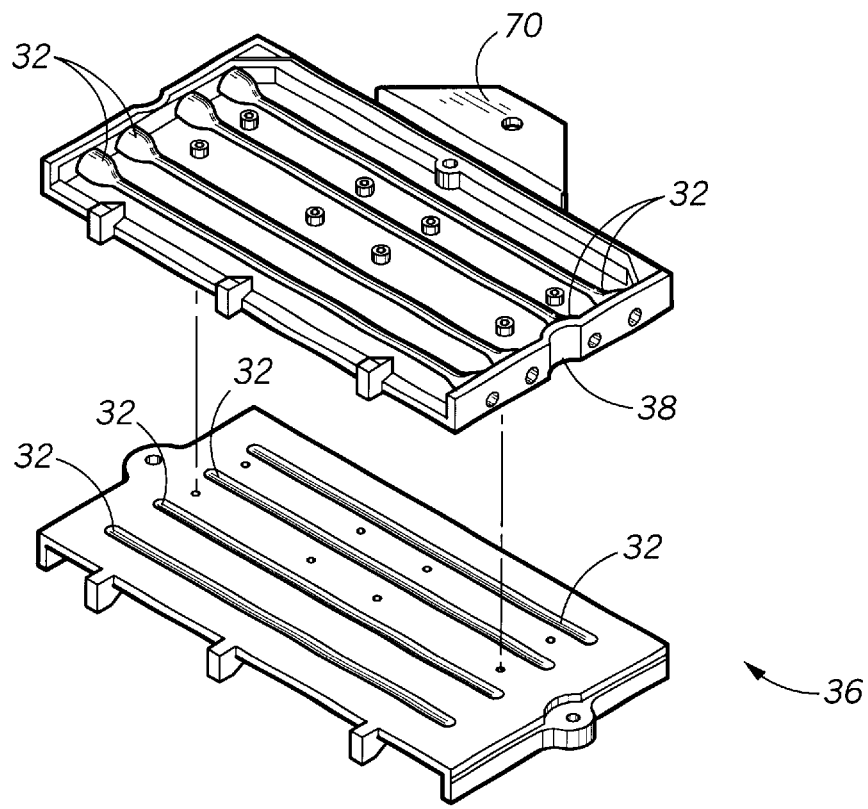
FIG. 4 is an exploded perspective view of a cooling module having a first plate and a second plate, according to one preferred embodiment.
Figure 8:
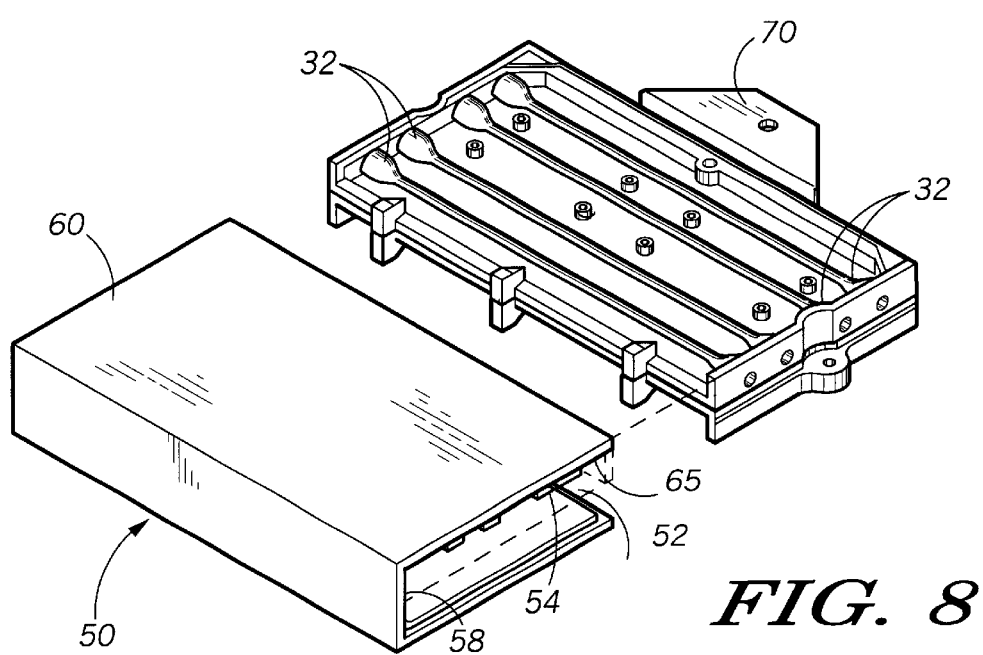
FIG. 8 is an exploded perspective view of a cooling module and an electronic control unit, according to one preferred embodiment.

Preferably, circuit substrate 58 is a printed circuit board manufactured from any one of a number of materials known to one of ordinary skill in the art, such as epoxy glass, FR4, and polyamide. In one preferred embodiment, circuit substrate 58 is a flat sheet that is formed by conventional methods, as illustrated in FIG. 8. In one preferred embodiment, circuit substrate 58 is bent in at least one place, as illustrated in FIG. 1. Circuit substrate 58 may be bent using a Polybent™ process, as described in U.S. Pat. No. 5,998,738, the text of which is incorporated by reference herein. The Polybent™ process essentially takes a flat circuit substrate 58 and folds circuit substrate 58 at least once. If circuit substrate 58 is folded twice, a u-shaped circuit substrate 58 can be formed, as illustrated in FIGS. 1–3. While in the above embodiments circuit substrate 58 is bent using a Polybent™ process, circuit substrate 58 may be bent using any technique known to one of ordinary skill in the art. In one preferred embodiment, circuit substrate 58 is not bent, but instead includes two portions that are electrically connected. Circuit substrate 58 may form an L-shape, a T-shape, a U-shape, or any shape desired.

In one preferred embodiment, substrate 50 also includes a housing 60. Housing 60 surrounds circuit substrate 58 and is designed to shield circuit substrate 58 from electrical charge which can damage circuit substrate 50. Housing 60 is manufactured from materials that are rigid enough to protect the electronic components 54 and that have elements designed to shield the electronic components 54 from heat, water, chemicals, and electrostatic charge. Housing 60 is manufactured from any known materials used to protect circuit substrates such as aluminum, steel, engineering grade plastic, magnesium, and zinc or any material that is resistant to chemicals and elements commonly found in an automobile.

Housing 60 may be a monolithic structure, or housing 60 may be assembled from a series of pieces. In one preferred embodiment, housing 60 is assembled from and includes a series of metal plates 61 as shown in FIG. 3. Metal plates 61 surround the outside surface of circuit substrate 58 while electronic components 54 are placed in the inside surface of circuit substrate 58. In one preferred embodiment, housing 60 includes a single metal plate 61 that surrounds the outside surface of circuit substrate 58, as illustrated in FIG. 1. Preferably, housing 60 is sealed to prevent elements such as dust, water, and other chemicals from entering housing 60 and damaging the electronic components 54. In one preferred embodiment, housing 60 is designed to mate with cooling module 36, as illustrated in FIGS. 1–2, and 8. By designing housing 60 to mate with cooling module 36, the components within electronic control unit 20 can more easily be serviced.

Substrate 50 is configured to define an interior region 52 and to have an electronic component 54 mounted thereto, such that the electronic component 54 faces the interior region 52. When substrate 50 includes a single, flat printed circuit board, interior region 52 is defined herein as the region above substrate 50 that encompasses electronic component 54, as illustrated by the dashed lines in FIG. 8. When substrate 50 includes a u-shaped printed circuit board having two main portions 65 which face each other, interior region 52 is defined herein as the region between each main portion 65, as illustrated in FIG. 1.

Cooling module 36 is located within and cools interior region 52. Cooling module 36 is designed to cool circuit substrate 58, and in particular, cool the electronic components 54 mounted on circuit substrate 58. Cooling module 36 does not cool electronic components 54 or circuit substrate 58 by only using conduction, that is, by coming into direct physical contact with electronic component 54 or circuit substrate 58. Instead, cooling module 36 cools circuit substrate 58 and electronic components 54 using convection as well as conduction. As used herein, convection refers heat transfer between a solid surface and a moving fluid, wherein the solid surface and the moving fluid are at different temperatures. Additionally, as used herein, the term "cool" refers to reducing the temperature of an element or object. Cooling module 36 cools circuit substrate 58 and electronic components 54 through conduction by physically placing cooling module 36 is contact with housing 60. Since housing 60 is in direct contact with circuit substrate 58 and electronic components 54, housing 60 draws the heat generated from electronic components 54 to cooling module 36 using conduction.

Figure 5:
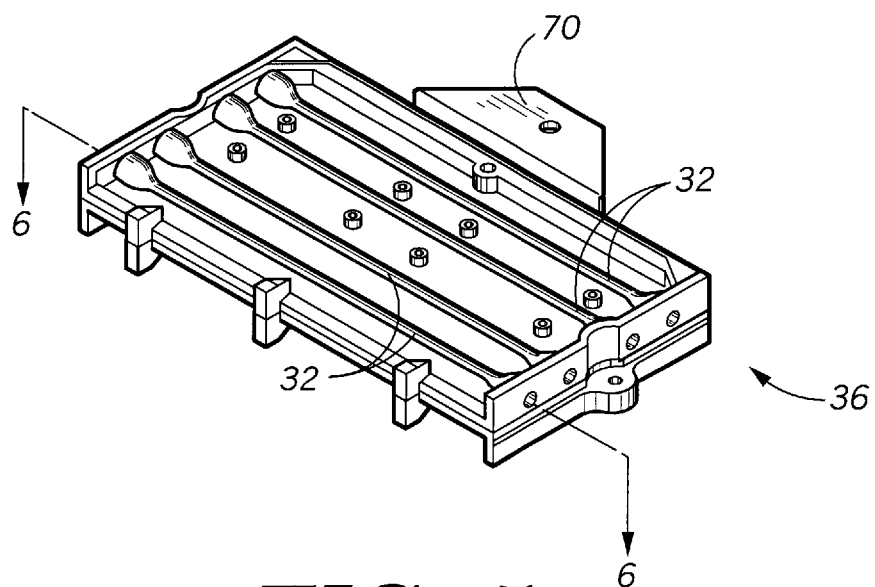
FIG. 5 is a perspective view of a cooling module, according to one preferred embodiment.
Figure 6:
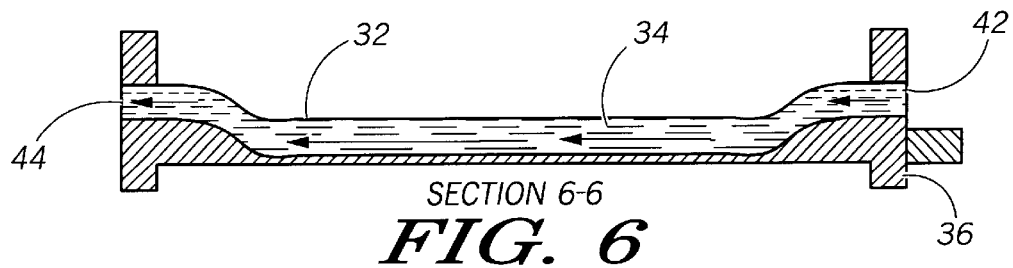
FIG. 6 is a cross-sectional view along lines 6—6 of the cooling module shown in FIG. 5, according to one preferred embodiment.

In one preferred embodiment, cooling module 36 cools circuit substrate 58 and electronic components 54 through convection by using cooling fluid 34 pumped through a fluid channel 32. Fluid channel 32 is located within cooling module 36 or on the surface of cooling module 36, as illustrated in FIGS. 5 and 6. Fluid channel 32 is a hollow tube-shaped member that allows for the flow of a fluid such as cooling fluid 34. Fluid channel 32 includes an inlet 42 for receiving cooling fluid 34 into interior region 52 and an outlet 44 for removing cooling fluid 34 from interior region 52. Cooling module 36 and fluid channel 32 are located within interior region 52. A flowing medium 74, such as air, liquid or liquid-vapor, separates cooling module 36 and fluid channel 32 from electronic components 54 and circuit substrate 58. Cooling module 36 draws heat away from, and therefore cools, medium 74 by flowing cooling fluid 34 having a temperature below an operating temperature of the electronic component 54 through fluid channel 32. Medium 74 in turn draws heat away from, and therefore cools, electronic component 54. Since medium 74 is always in contact with both electronic component 54 and fluid channel 32, vibrations caused or induced by the engine, which in turn cause electronic components 54, circuit substrate 58, and fluid channel 32 to vibrate, will not affect the cooling efficiency of cooling module 36.

Cooling module 36 is manufactured from any material that can be used to form elements such as fluid channel 32 and that allows for the flow of heat, such as, for example, copper, silver, gold, iron, steel, aluminum, nickel, chrome, gold-plated metal, or any other metal or combination of metals or material which allows for the flow of heat from one area to another. Cooling module 36 can either be manufactured from a single piece of material or be manufactured from multiple pieces of material. In one preferred embodiment cooling module 36 includes first plate 38 connected with second plate 40. Preferably, first plate 38 and second plate 40 are joined together to form at least one fluid channel 32. A sealing gasket (not shown) is placed between first plate 38 and second plate 40 in order to seal fluid channel 32. In one preferred embodiment, the coefficient of thermal expansion of the cooling module 36 and substrate 50 are substantially the same.

Figure 7:
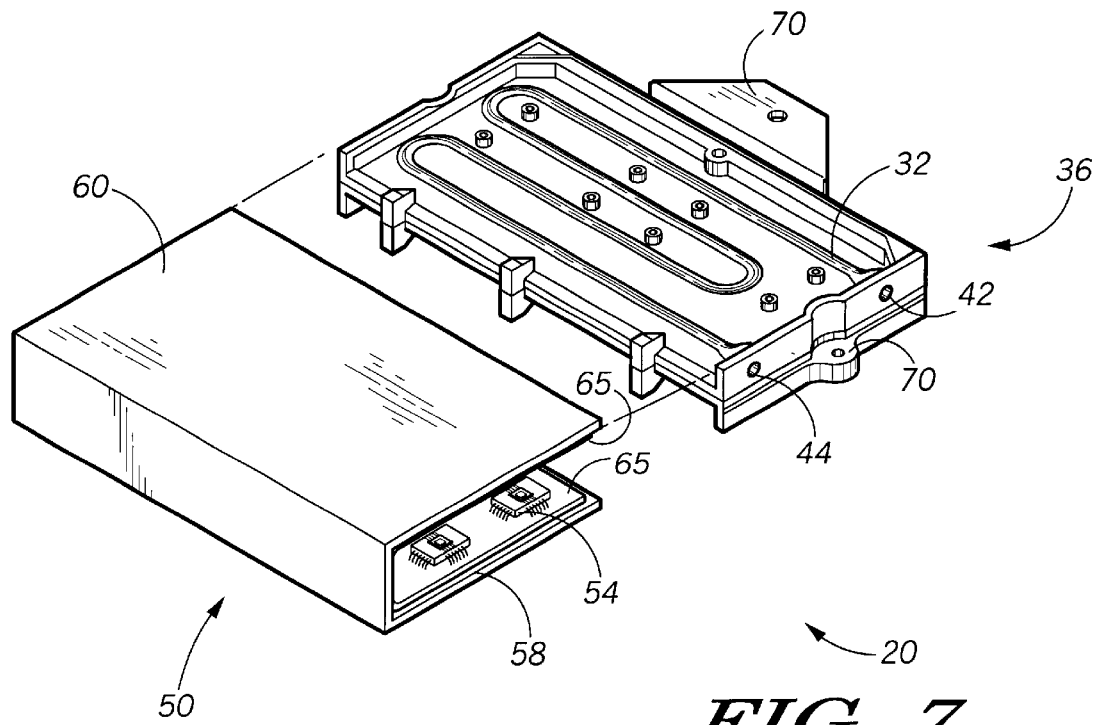
FIG. 7 is an exploded perspective view of a cooling module and an electronic control unit, according to one preferred embodiment.

Preferably, cooling module 36 includes multiple fluid channels 32, as illustrated in FIGS. 1–5 and 8. Multiple fluid channels 32 having multiple inlets 42 and multiple outlets 44 can significantly increase the cooling efficiency of the cooling module 36. Additionally, a single fluid channel 32 having a single inlet 42 and a single outlet 44 may also be used to reduce the number of inlets 42 and outlets 44. Fluid channel 32 may flow straight across cooling module 36, as illustrated in FIGS. 1–6 and 8, or fluid channel 32 may bend and curve within the cooling module 36 so as to allow multiple passes through the interior region 52 of substrate 50, as illustrated in FIG. 7. As illustrated in FIG. 6, cooling fluid 34 enters fluid channel 32 and inlet 42 and exits fluid channel 32 and outlet 44. Cooling fluid 34 has a temperature at inlet 42 and outlet 44 which is less than the operating temperature of an electronic component 54 mounted onto a circuit substrate 58 within electronic control unit 20. As heat is transferred from electronic component 54 to the cooling fluid 34, the temperature of the cooling fluid 34 is raised and the temperature of electronic component 54 is reduced. The temperature of electronic component 54 can be controlled not only by the amount of cooling fluid 34 present within fluid channel 32, but also by the rate at which cooling fluid 34 is pumped through fluid channel 32. By maintaining the temperature of cooling fluid 34 below an operating temperature of electronic component 54, heat generated by electronic component 54 can be convectively transferred to the cooling fluid 34 moving within fluid channel 32 of cooling module 36. As discussed above, cooling fluid 54 never comes into direct contact with electronic component 54, but rather heat from electronic component 54 travels through medium 74 in interior region 52 to fluid channel 32 and into cooling fluid 34. Cooling fluid 34 then travels through fluid channel 32 and carries the heat dissipated from electronic component 54 away from electronic component 54 and through outlet 44. By using convection to transfer heat dissipated from electronic component 54 away from electronic component 54, heat from the electronic component 54 can be dissipated in a relatively efficient manner irregardless whether the electronic control unit 20 is vibrating or not.

The cooling module 36 of the present invention can utilize essentially any commercially available cooling fluid including refrigerants, such as for example chlorofluorocarbons, hydrochlorofluorocarbons and hydrofluorocarbons, fuel such as diesel fuel, unleaded fuel and/or jet fuel, antifreeze such as ethylene glycol, air, water, any aqueous solution, or any other fluid. If electronic control unit 20 is attached to an engine block or used in an automobile, cooling module 36 may utilize fuels such as diesel fuel or unleaded fuel from an automobile gas tank as cooling fluid 34.

In one preferred embodiment, electronic control unit 20 includes mounting means 70 for mounting electronic control unit 20 to a second member. Mounting means 70 may be any device or member which can be used to mount electronic control unit 20, such as a flat plate and a screw, a belt, a hook and loop type fastener, a cable, a snap-fit member, or a captivating spring. In one preferred embodiment, the second member is a vehicle, an engine block for a vehicle, or the interior of an engine compartment for any vehicle.

Thus it is apparent that there it has been provided in accordance with the invention an electronic control unit with integrated cooling module that fully provides the advantage set forth above. Although the invention has been described and illustrated with reference to specific illustrated embodiments thereof, it is not intended that the invention be limited to those illustrated embodiments. Those skilled in the art would recognize that variations and modifications can be made without departing from the spirit of the invention.

We claim:

1. A electronic control unit comprising:
   a cooling module having a first plate and second plate, the first plate contacting the second plate to define at least one fluid channel therebetween;
   a substrate configured to define an interior region and having an electronic component mounted to the substrate, such that the electronic component faces the interior region; and
   a cooling fluid within the fluid channel, the cooling fluid having a temperature below an operating temperature of the electronic component, wherein the cooling module is positioned within the interior region, such that heat generated by the electronic component is convectively transferred to the cooling module.

2. The electronic control unit of claim 1, wherein one of the first and second plates includes an inlet and an outlet coupled to the fluid channel.

3. The electronic control unit of claim 1, wherein the substrate comprises a U-shaped housing and a U-shaped circuit substrate, the U-shaped circuit substrate attached to the U-shaped housing, the electronic component mounted to the circuit substrate of the substrate.

4. The electronic control unit of claim 1, wherein the fluid comprises a fluid selected from the group consisting of fuel, air, and an aqueous solution.

5. The electronic control unit of claim 4, wherein the fuel comprises a hydrocarbon fuel selected from the group consisting of diesel fuel and gasoline.

6. The electronic control unit of claim 1, wherein the substrate comprises a housing having a series of plates fastened together, and wherein at least one plate has a circuit substrate attached to the plate and positioned in proximity to the cooling module.

7. The electronic control unit of claim 1 further comprising mounting means for mounting the cooling unit to a vehicle.

8. The electronic control unit of claim 1, wherein the cooling module and the substrate are each characterized by a coefficient of thermal expansion, and wherein the coefficient of thermal expansion of the cooling module and the substrate are substantially the same.

9. An electronic control unit comprising:
   a cooling module having at least one fluid channel therein;
   a U-shaped housing defining an interior region, the cooling module positioned in the interior region;
   a circuit substrate attached to the housing having a portion in the proximity to the cooling module and separated from the cooling module by a medium; and
   a fluid in the at least one fluid channel, the fluid having a temperature below the temperature of the circuit substrate, such that heat is convectively transferred from the circuit substrate to the cooling module through the medium.

10. The electronic control unit of claim 9, wherein the housing comprises a plurality of coupled metal plates.

11. The electronic control unit of claim 9, wherein the cooling module comprises a first plate and a second plate, the first plate contacting the second plate to define at least a portion of the fluid channel therebetween.

12. The electronic control unit of claim 11, wherein one of the first and second plates includes an inlet and an outlet coupled to the fluid channel.

13. The electronic control unit of claim 9, wherein the fluid comprises a fluid selected from the group consisting of a fuel, air, and an aqueous solution.

14. The electronic control unit of claim 13, wherein the fuel comprises a hydrocarbon fuel selected from the group consisting of diesel fuel and gasoline.

15. An electronic control unit comprising:
   a U-shaped housing;
   a circuit substrate attached to an interior surface of the housing by an adhesive;
   at least one electronic component within the housing and mounted to the circuit substrate, the at least one electronic component having an operating temperature;
   a cooling module centrally positioned within the housing, the cooling module having a fluid channel therein, wherein the cooling module is separated from the at least one electronic component by a medium; and
   a fluid in the fluid channel, wherein the fluid has a temperature lower than the operating temperature of the electronic component, such that heat is convectively transferred from the electronic component to the cooling module.

16. The electronic control unit of claim 15, wherein the housing comprises a plurality of coupled metal plates.

17. The electronic control unit of claim 15, wherein the fluid comprises a fluid selected from the group consisting of a fuel, air, and an aqueous solution.

18. The electronic control unit of claim 17, wherein the fuel comprises a hydrocarbon fuel selected from the group consisting of diesel fuel and gasoline.

* * * * *